(12) United States Patent
Chang et al.

(10) Patent No.: US 8,900,924 B2
(45) Date of Patent: Dec. 2, 2014

(54) CHIP PACKAGE AND METHOD FOR FORMING THE SAME

(71) Applicant: Xintec Inc., Jhongli, Taoyuan County (TW)

(72) Inventors: Shu-Ming Chang, Tucheng (TW); Tsang-Yu Liu, Zhubei (TW); Yen-Shih Ho, Kaohsiung (TW)

( * ) Notice: Subject to any disclaimer, the term of this patent is extended or adjusted under 35 U.S.C. 154(b) by 0 days.

(21) Appl. No.: 14/173,340

(22) Filed: Feb. 5, 2014

(65) Prior Publication Data

US 2014/0154840 A1 Jun. 5, 2014

Related U.S. Application Data

(62) Division of application No. 13/340,162, filed on Dec. 29, 2011, now Pat. No. 8,674,518.

(60) Provisional application No. 61/429,380, filed on Jan. 3, 2011.

(51) Int. Cl.
*H01L 25/00* (2006.01)
*H01L 21/822* (2006.01)
(Continued)

(52) U.S. Cl.
CPC ............ *H01L 25/50* (2013.01); *H01L 21/8221* (2013.01); *B81C 1/00238* (2013.01); *B81C 2203/0785* (2013.01); *B81C 2203/0792* (2013.01); *H01L 21/76898* (2013.01); *H01L 23/10* (2013.01); *H01L 24/05* (2013.01); *H01L 24/13* (2013.01); *H01L 24/94* (2013.01); *H01L 25/0657* (2013.01); *H01L 2224/02372* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/05548* (2013.01); *H01L 2224/05624* (2013.01); *H01L 2224/05644* (2013.01); *H01L 2224/05647* (2013.01); *H01L 2224/05669* (2013.01); *H01L 2224/13022* (2013.01); *H01L 2924/14* (2013.01); *H01L 2924/1461* (2013.01); *H01L 2225/06513* (2013.01); *H01L 2225/06541* (2013.01); *H01L 2924/01029* (2013.01); *H01L 24/14* (2013.01); *H01L 24/16* (2013.01); *H01L 24/73* (2013.01); *H01L 2224/05567* (2013.01);

(Continued)

(58) Field of Classification Search
CPC ................. H01L 21/8221; H01L 2225/06503; H01L 21/486; H01L 21/76898; H01L 2924/1461
USPC .......................................... 438/109, 110, 113
See application file for complete search history.

(56) References Cited

U.S. PATENT DOCUMENTS

2007/0117348 A1\* 5/2007 Ramanathan et al. ........ 438/455
2009/0309235 A1\* 12/2009 Suthiwongsunthorn et al. ............................ 257/777

FOREIGN PATENT DOCUMENTS

CN 101582432 11/2009

*Primary Examiner* — Peniel M Gumedzoe
(74) *Attorney, Agent, or Firm* — Liu & Liu

(57) ABSTRACT

An embodiment of the invention provides a chip package which includes: a first chip; a second chip disposed on the first chip; a hole extending from a surface of the first chip towards the second chip; a conducting layer disposed on the surface of the first chip and extending into the hole and electrically connected to a conducting region or a doped region in the first chip; and a support bulk disposed between the first chip and the second chip, wherein the support bulk substantially and/or completely covers a bottom of the hole.

30 Claims, 9 Drawing Sheets

(51) Int. Cl.
*B81C 1/00* (2006.01)
*H01L 21/768* (2006.01)
*H01L 23/10* (2006.01)
*H01L 25/065* (2006.01)
*H01L 23/00* (2006.01)

(52) U.S. Cl.
CPC .. *H01L 2224/056* (2013.01); *H01L 2224/1403* (2013.01); *H01L 2224/14181* (2013.01); *H01L 2224/14517* (2013.01); *H01L 2224/73103* (2013.01); *H01L 2224/94* (2013.01)
USPC ............................ 438/109; 438/110; 438/113

CHIP PACKAGE AND METHOD FOR FORMING THE SAME

CROSS REFERENCE TO RELATED APPLICATIONS

This application is a Divisional of U.S. application Ser. No. 13/340,162, filed on Dec. 29, 2011, which claims the benefit of U.S. Provisional Application No. 61/429,380, filed on Jan. 3, 2011, the entirety of which are incorporated by reference herein.

BACKGROUND OF THE INVENTION

1. Field of the Invention

The invention relates to a chip package, and in particular relates to a chip package having at least two stacked chips.

2. Description of the Related Art

The chip packaging process is an important process when fabricating an electronic product. Chip packages not only provide chips with protection from environmental contaminants, but also provide an interface for connections between electronic elements in the chips and electronic elements outside of the chip package.

Improving reliability and structural stability of a chip package has become an important issue.

BRIEF SUMMARY OF THE INVENTION

An embodiment of the invention provides a chip package which includes: a first chip; a second chip disposed on the first chip; a hole extending from a surface of the first chip towards the second chip; a conducting layer disposed on the surface of the first chip and extending into the hole to electrically connect to a conducting region or a doped region in the first chip; and a support bulk disposed between the first chip and the second chip, wherein the support bulk substantially and/or completely covers a bottom of the hole.

An embodiment of the invention provides a method for forming a chip package which includes: providing a first substrate; forming a support bulk on a surface of the first substrate; providing a second substrate; bonding the second substrate on the surface of the first substrate; removing a portion of the first substrate from a second surface of the first substrate to form a hole extending towards the support bulk on the first substrate, wherein the support bulk substantially and/or completely covers a bottom of the hole; and forming a conducting layer on the second surface of the first substrate, wherein the conducting layer extends into the hole to electrically connect to a conducting region or a doped region in the first substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
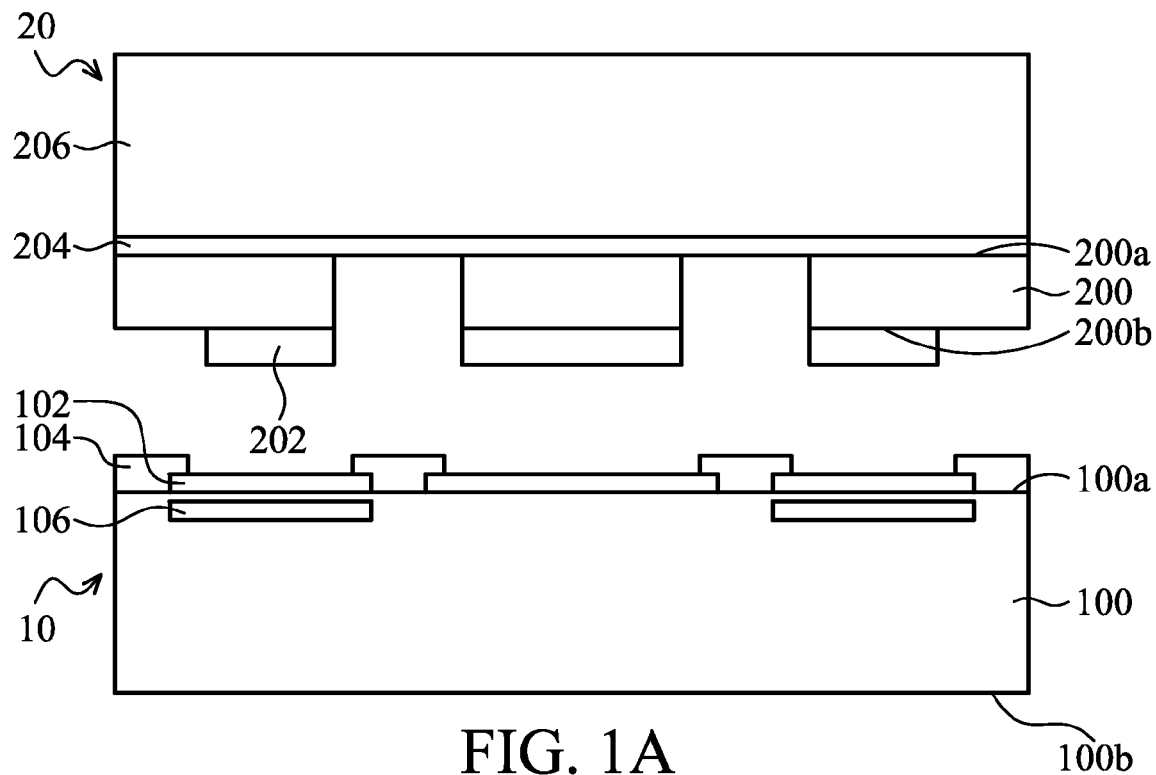
FIGS. 1A-1I are cross-sectional views showing the steps of forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of stacked chips. For example, the chip package of the embodiments of the invention may be applied to package stacked package structure including the following chips including, for example, active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

FIGS. 1A-1I are cross-sectional views showing the steps of forming a chip package according to an embodiment of the present invention. As shown in FIG. 1A, a substrate 10 and a substrate 20 are provided. The substrate 10 and the substrate 20 may be two semiconductor wafers. For example, the substrate 10 may be (but is not limited to) a wafer including a plurality of control ICs and having a plurality of predetermined scribe lines defined thereon to divide the substrate 10 into a plurality of regions. These regions may be formed with control ICs, respectively, which may include CMOS devices. The substrate 20 may be (but is not limited to) a wafer including a plurality of MEMS devices and having a plurality of predetermined scribe lines defined thereon to divide the substrate 20 into a plurality of regions. These regions may be formed with MEMS devices, respectively. In the substrate 20, a plurality of holes or recesses needed for operation of MEMS devices are formed.

As shown in FIG. 1A, the substrate 10 may include a semiconductor substrate 100 which may be formed with at least a conducting region 106. The conducting region 106 is, for example, a conducting pad which may be electrically connected to a device region in the semiconductor substrate 100. For example, the conducting region 106 may be electrically connected to CMOS devices in the semiconductor substrate. Alternatively, in another embodiment, the conducting region 106 is substantially a doped region.

The substrate 20 may include a semiconductor layer 200 and a carrier substrate 206. A bonding layer 204 may be formed between a surface 200a of the semiconductor layer 200 and the carrier substrate 206. For example, in one embodiment, the substrate 20 may include a semiconductor on insulator substrate (SOI substrate). In this case, the bonding layer 204 is, for example, a silicon oxide layer.

As shown in FIG. 1A, a connection layer 102 may be formed on a surface 100a of the substrate 100, and an insulating layer 104 may be optionally formed on the surface 100a of the substrate 100. The insulating layer 104 has an opening exposing the connection layer 102. The connection layer 102 may be used to bond the substrate 10 with the substrate 20. In one embodiment, the material of the connection layer 102 may be a metal material such as gold, copper, aluminum, or the like. Alternatively, the material of the connection layer 102 may be a semiconductor material such as silicon, germanium, or the like. Similarly, a connection layer 202 may be formed on a surface 200b of the semiconductor layer 200. In one embodiment, the substrate 20 and the substrate 10 may be bonded with each other through the connection layers 102 and 202 therebetween.

Figure 1B:
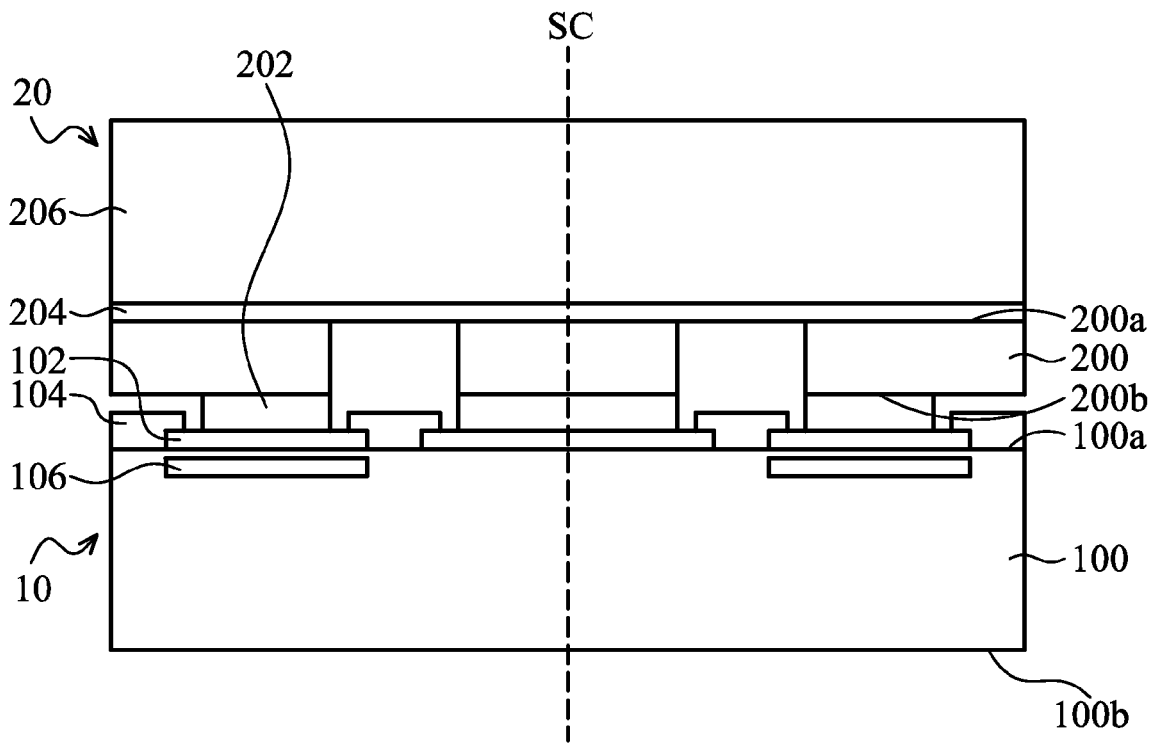

As shown in FIG. 1B, the connection layers on the substrate 20 and the substrate 10 may be aligned to bond with each other to connect the two substrates. The bonding between the connection layer 102 and the connection layer 202 may be (but is not limited to) a metal to semiconductor bonding, metal to metal bonding, or semiconductor to semiconductor bonding. The connection layer 202 may serve as a connection bulk used to bond the substrate 10 and the substrate 20.

After the substrate 10 and the substrate 20 are bonded, the substrate 100 may be optionally thinned to facilitate proceeding of subsequent processes. For example, the carrier substrate 206 may be used as a support, and the substrate 100 is thinned from a surface 100b of the substrate 100 to a suitable thickness. A suitable thinning process is, for example, a mechanical grinding process or chemical mechanical polishing process.

Figure 1C:
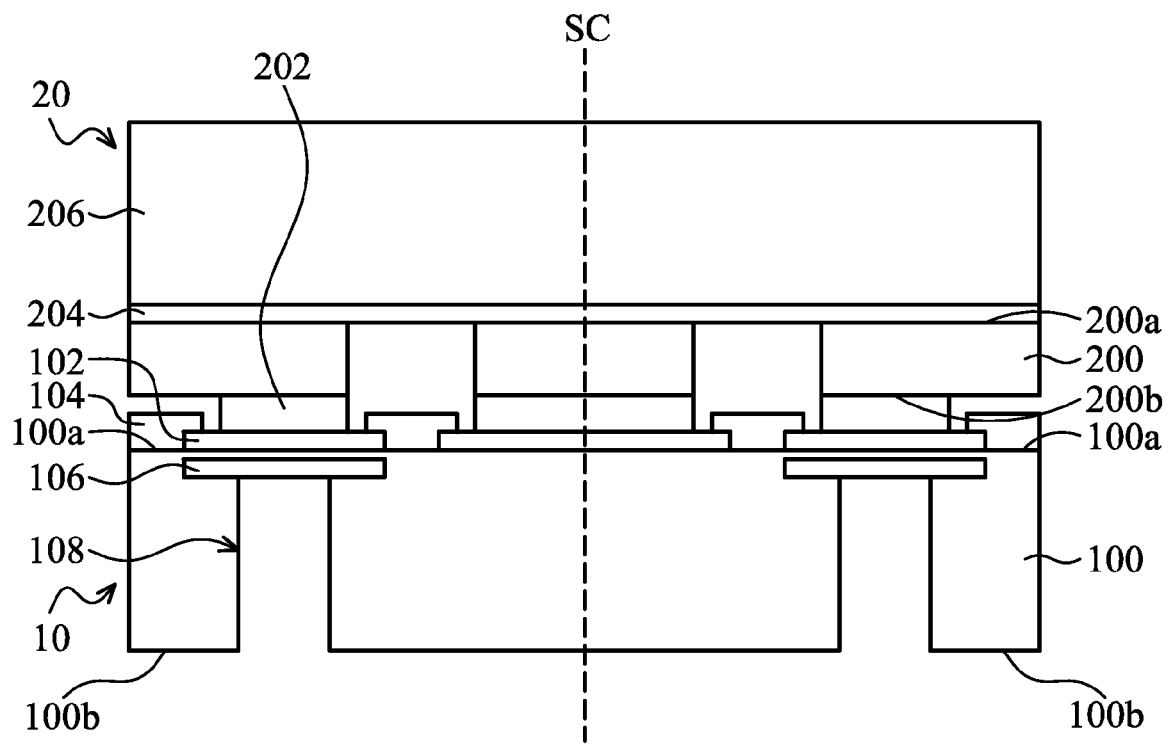

Next, as shown in FIG. 1C, a portion of the substrate 100 may be removed from the surface 100b of the substrate 100 to form a hole 108 which extends towards the conducting region 106 and one of the connection layer 102 by using, for example, a photolithography process and an etching process. In this case, the connection layer 102 not only is used to bond the substrate 20, but also may be used as a support bulk below a bottom of the hole 108 (i.e., an end of the hole 108 near the support bulk). In one embodiment, the support bulk (the connection layer 102) substantially and/or completely covers the bottom of the hole 108. In one embodiment, the support bulk (the connection layer 102) is separated from the bottom of the hole 108 by a distance without directly contacting with the bottom of the hole 108. The substrate 100 is typically needed to be thinned, and the structural strength of the substrate will be decreased after the hole 108 is formed. Thus, the conducting region 106 may be easily damaged. In the embodiment of the invention, because the bottom of the hole 108 is covered with the support bulk (the connection layer 102), it helps to increase the structural strength near the bottom of the hole 108, thus improving reliability of the chip package. Thus, in the bonding process of the substrate 10 and the substrate 20, it is not easy for the structure near the bottom of the hole 108 and the conducting region 106 to be broken. After subsequent packaging process steps are accomplished, the support bulk (the connection layer 102) may continue to enhance the structural strength of the chip package to ensure proper operation and continued use of the chip package.

Figure 1D:
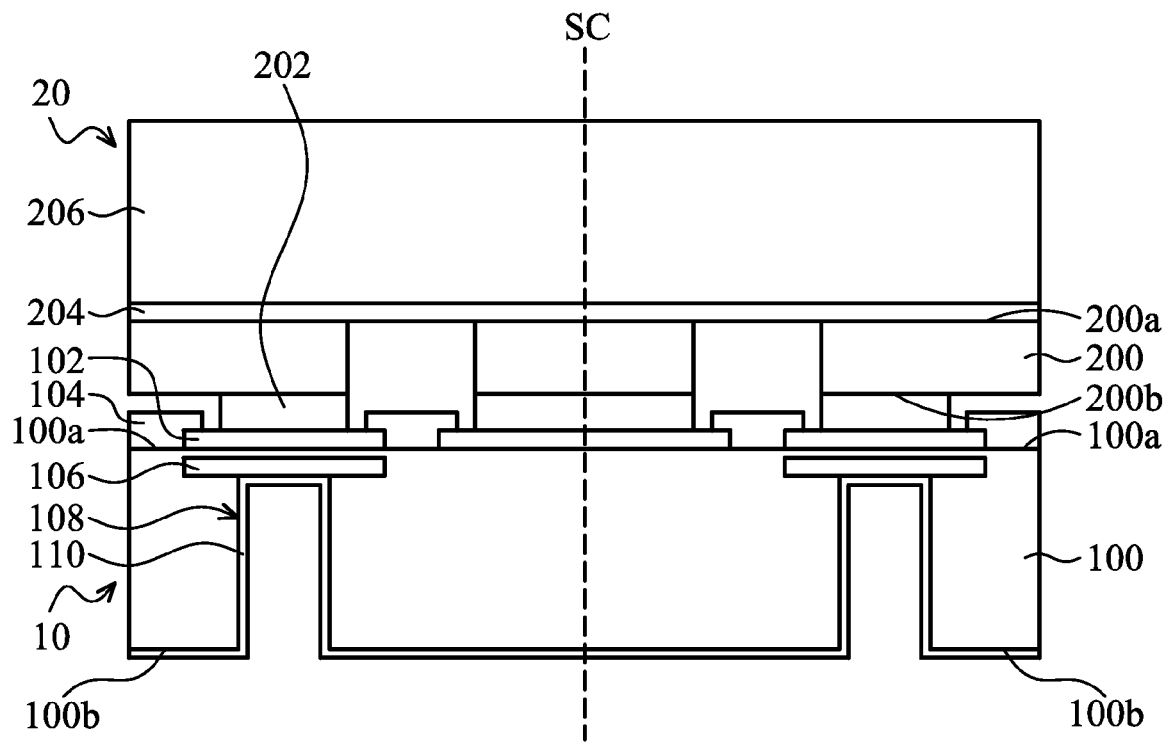

Next, as shown in FIG. 1D, an insulating layer 110 may be optionally formed on the surface 100b of the substrate 100. The insulating layer 110 may extend into the hole 108. The insulating layer 110 is, for example, an epoxy resin, a solder mask material, or other suitable insulating materials, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The insulating layer 110 may be formed by using a coating process, such as spin coating process, spray coating process, or curtain coating process, or other suitable deposition methods, such as liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition. However, in one embodiment, it should be appreciated that the formation of the insulating layer 110 is not necessary. In the case that no short circuiting issue exists between a subsequently formed conducting layer and the substrate, the insulating layer 110 may not need to be formed.

Figure 1E:
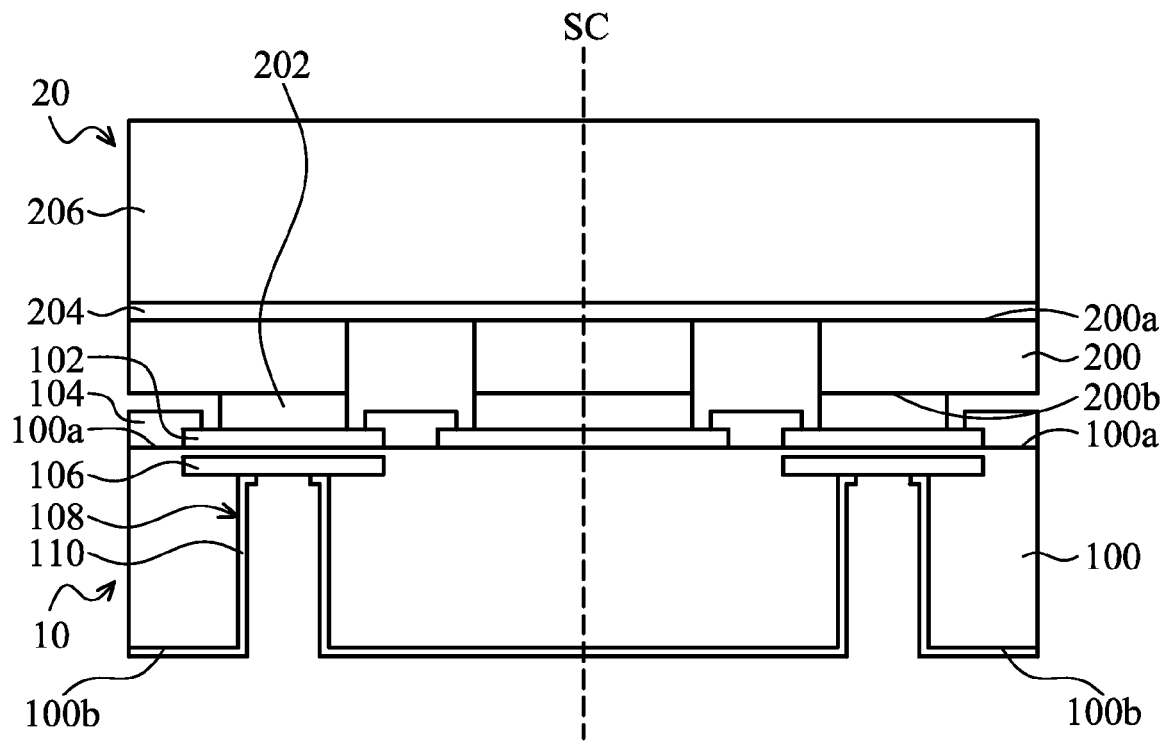

Next, as shown in FIG. 1E, a portion of the insulating layer 110 located on the bottom of the hole 108 is removed such that a portion of the conducting region 106 is exposed.

Figure 1F:
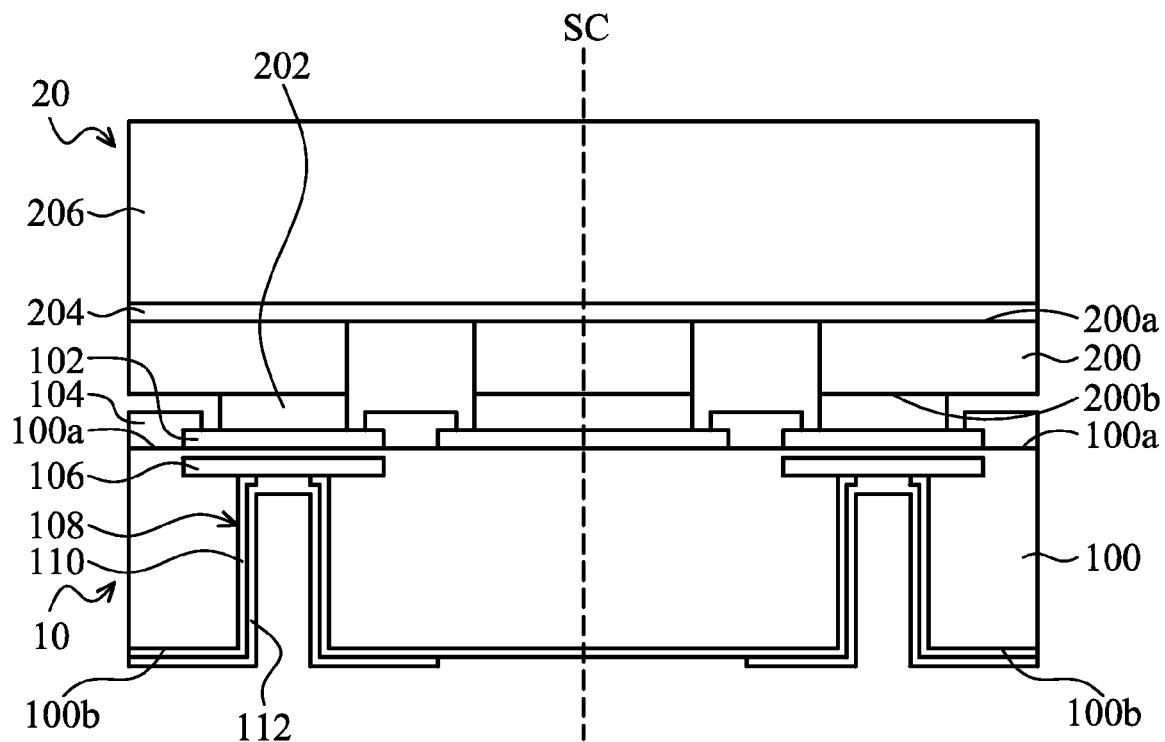

As shown in FIG. 1F, a conducting layer 112 is formed on the surface 100b of the substrate 100. The conducting layer 112 may extend into the hole 108 to electrically connect to the conducting region 106. The material of the conducting layer 112 may include copper, aluminum, gold, platinum, or the like. The formation method of the conducting layer 112 may be a physical vapor deposition, sputtering, chemical vapor deposition, electroplating, or electroless plating. The conducting layer 112 may be patterned by using a photolithography process and an etching process.

Figure 1G:
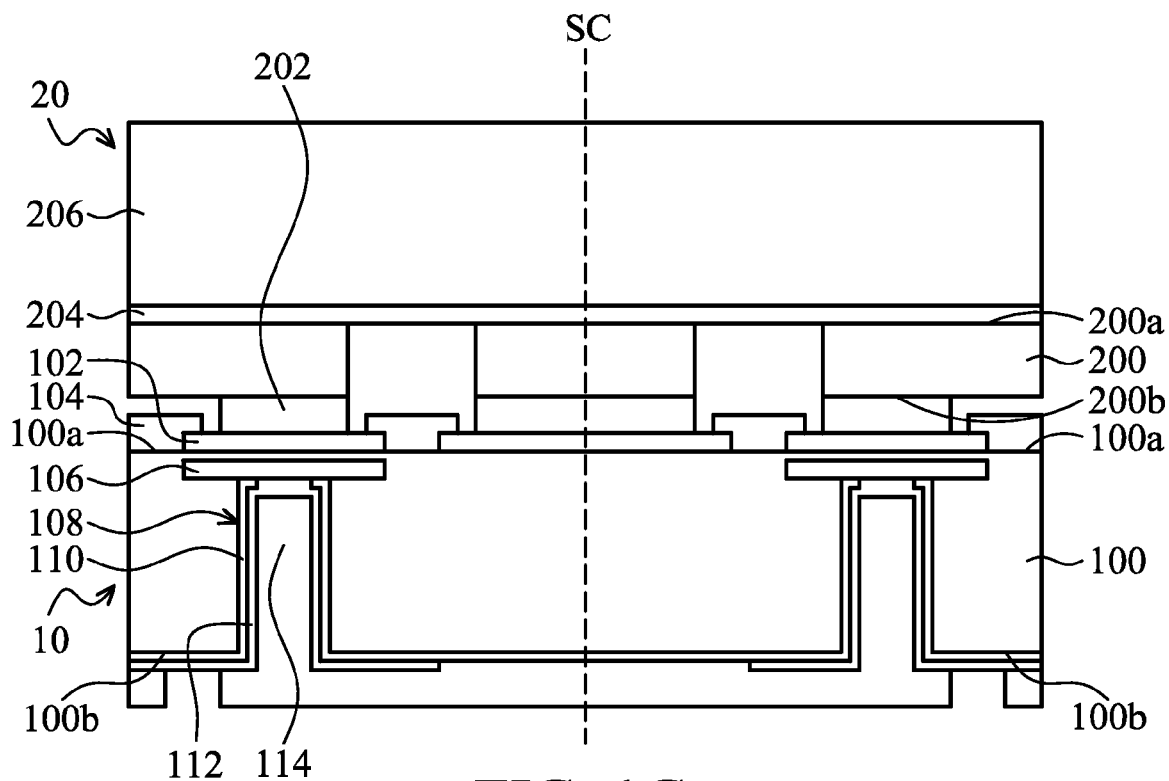
Figure 1H:
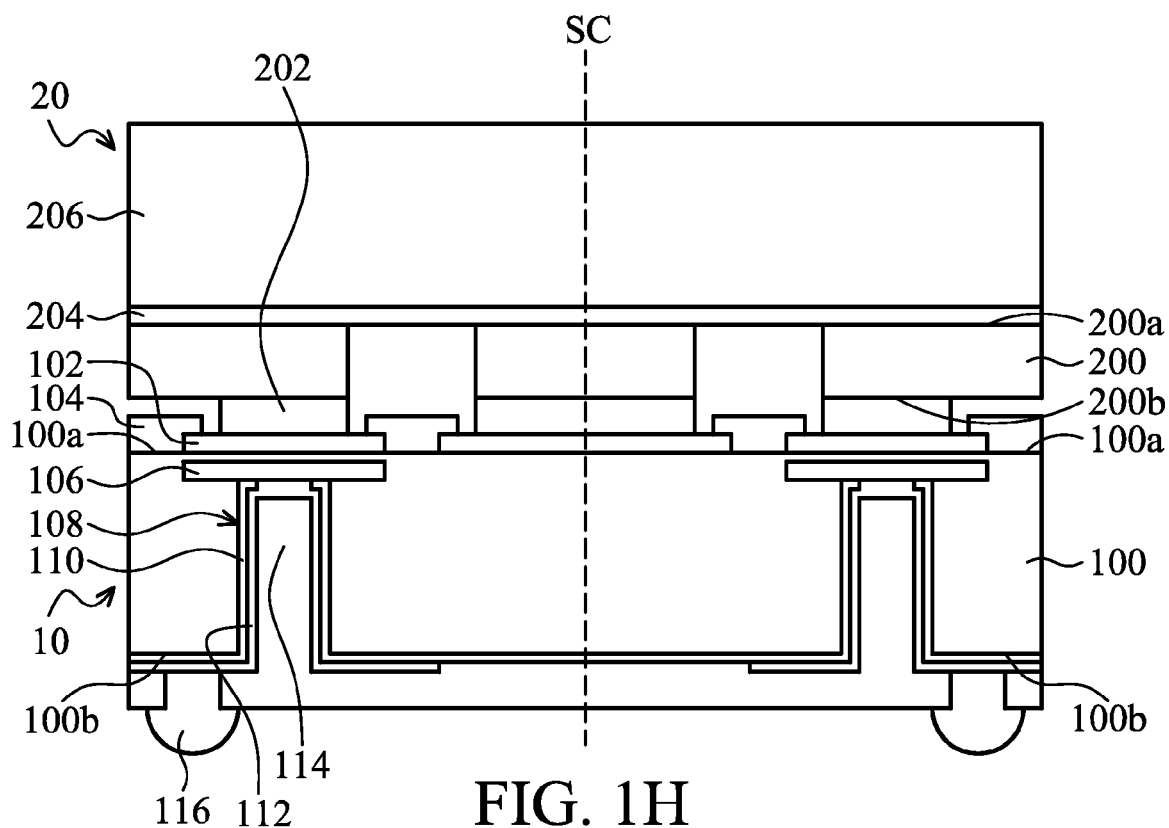

Next, as shown in FIG. 1G, a protection layer 114 may be formed on the surface 100b of the substrate 100. The protection layer 114 has an opening exposing the conducting layer 112. Then, as shown in FIG. 1H, a conducting bump 116 is formed on the exposed conducting layer 112.

Figure 1I:
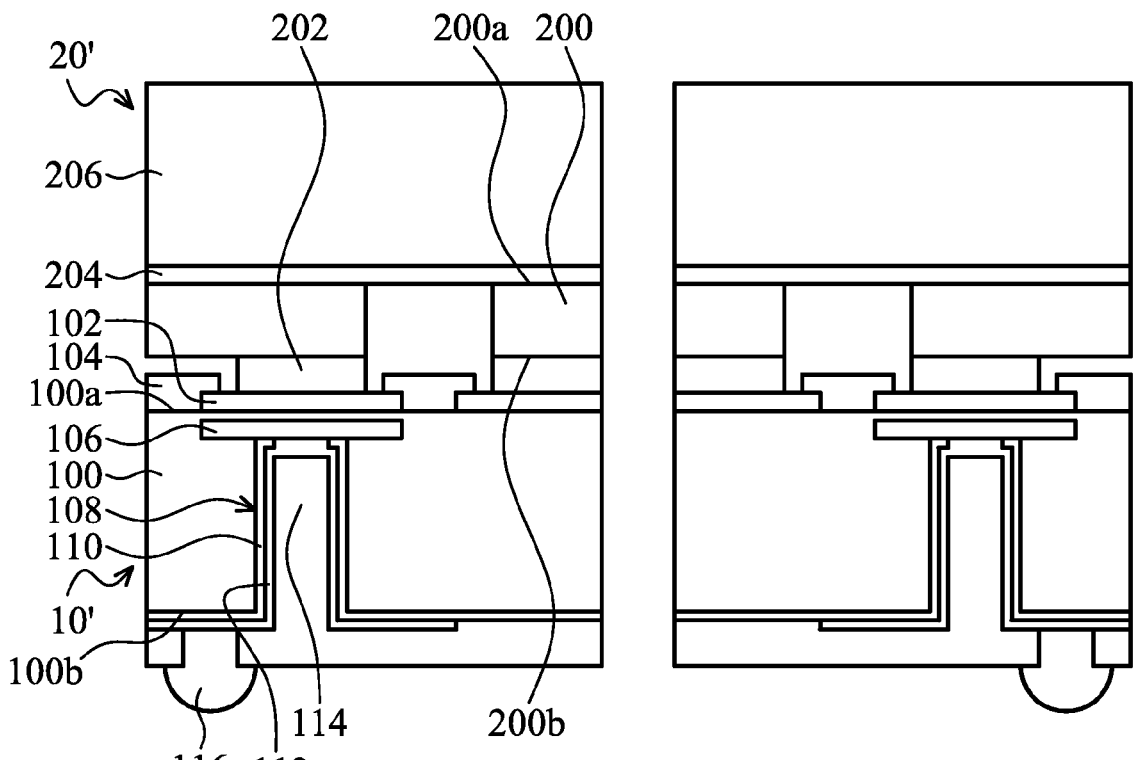

As shown in FIG. 1I, the substrates 10 and 20 may be diced along a predetermined scribe line SC to form at least a chip package. As shown in FIG. 1I, in one embodiment, the chip package includes: a lower chip 10' (a portion of the substrate 10 after being diced); an upper chip 20' (a portion of the substrate 20 after being diced) disposed on the lower chip; the hole 108 extending from the surface 100b of the lower chip towards the upper chip; the conducting layer 110 disposed on the surface 100b of the lower chip and extending into the hole 108 to electrically connect to the conducting region 106 or a doped region; and the support bulk (102) disposed between the lower chip and the upper chip, wherein the support bulk (102) substantially and/or completely covers the bottom of the hole 108. In one embodiment, the connection layer 102 is a material having conductivity (such as a metal material), and the conducting region 106 is electrically connected to the connection layer 102 through conducting wires in the substrate 100. The connection layer 202 may also be a material having conductivity (such as a semiconductor material). Thus, the conducting region 106 in the lower chip may be electrically connected to a doped region in the semiconductor layer 200 of the upper chip through the support bulk.

Figure 2:
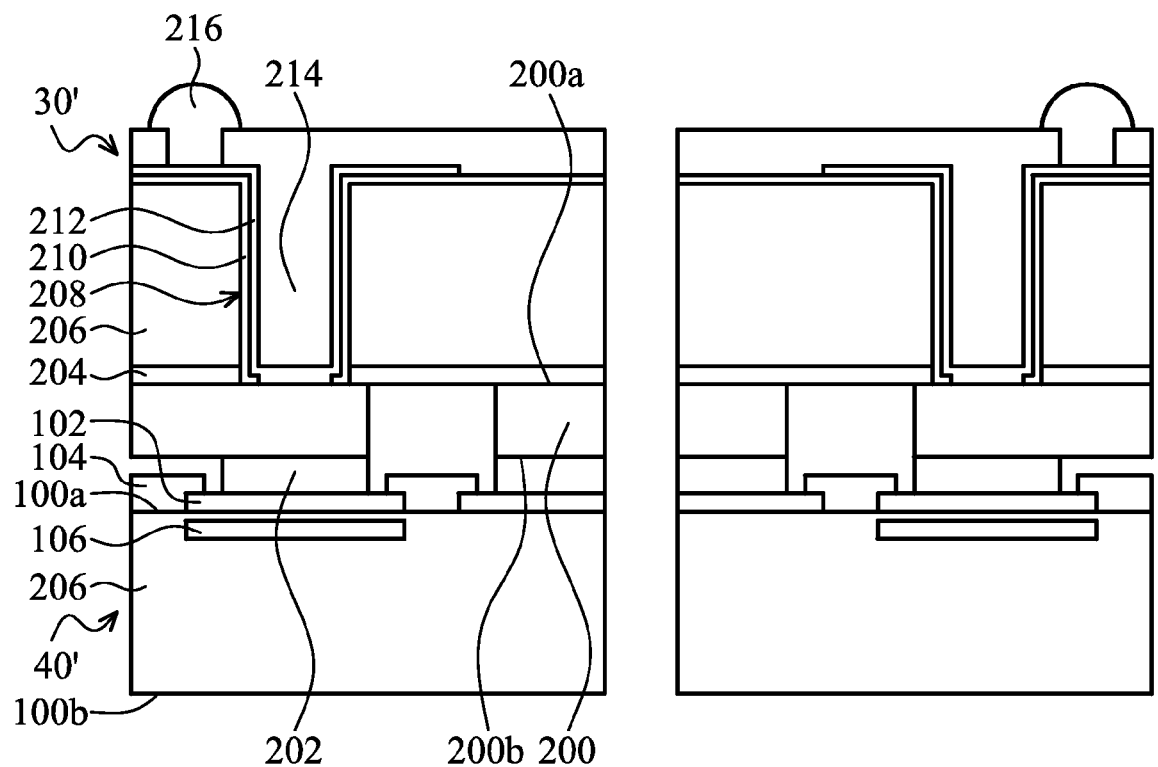
FIG. 2 is a cross-sectional view showing a chip package according to an embodiment of the present invention.

The embodiments of the invention may have many variations. For example, the hole 108 is not limited to be formed in the substrate 10. FIG. 2 is a cross-sectional view showing a chip package according to an embodiment of the present invention, wherein same or similar reference numbers are used to designate same or similar elements. In the embodiment shown in FIG. 2, a hole 208 extends from a surface of the carrier substrate 206 of the upper chip 30' towards the lower chip 40'. A conducting layer 212 is formed on an insulating layer 210 on a sidewall of the hole 208 and electrically contacts with the semiconductor layer 200. In one embodiment, the semiconductor layer 200 may include a doped region, wherein the doped region may electrically contact with the conducting layer 212. In the embodiment shown in FIG. 2, the connection layer 202 below the hole 208 may be used as a support bulk which may protect the structure above the bottom of the hole 208 from being broken during the bonding process with the connection layer 102 of the lower chip. Similarly, in one embodiment, the conducting region 106 of the lower chip 40' may be electrically connected to the conducting layer 212. Similarly, a protection layer 214 and a conducting bump 216 electrically connected to the conducting layer 212 may also be disposed on the upper chip 30'.

Figure 3A:
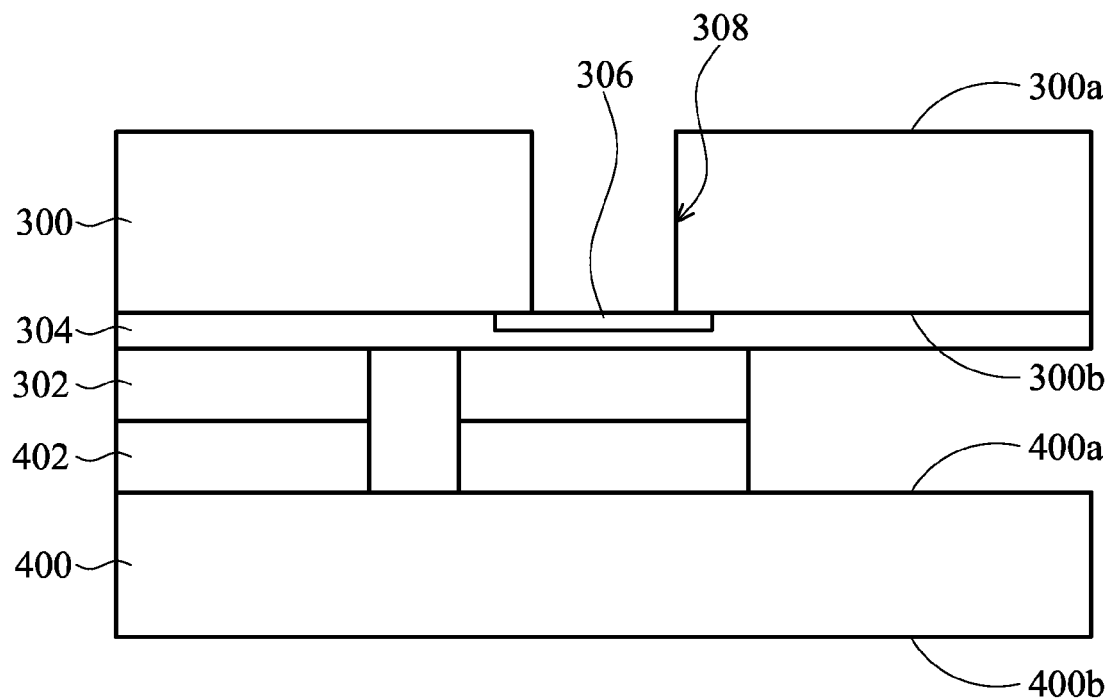
FIGS. 3A-3B are cross-sectional views respectively showing chip packages according to embodiments of the present invention.
Figure 3B:
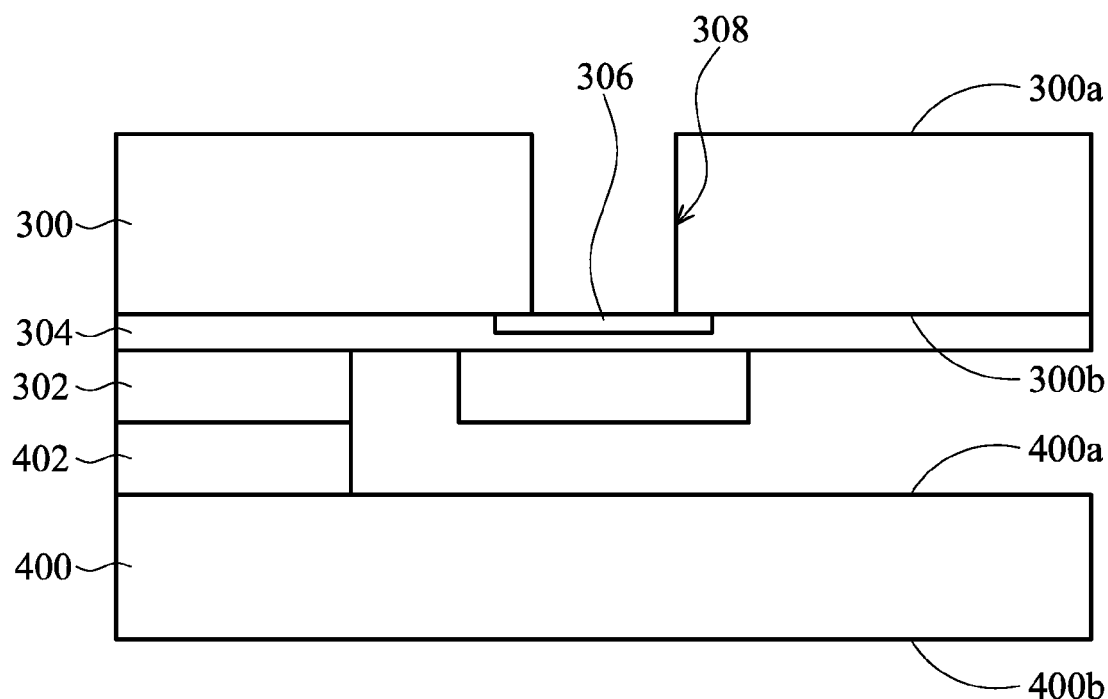

FIGS. 3A-3B are cross-sectional views respectively showing chip packages according to embodiments of the present invention. In the embodiment shown in FIG. 3A, a chip 300 and a chip 400 are bonded with each other respectively through connection layers 302 and 402 thereon. A hole 308 extends from a surface 300a of the chip 300 towards a surface 300b to expose a conducting region or a doped region 306. The connection layers 302 and 402 may together form a connection bulk used to bond the chip 300 and the chip 400. The connection layers 302 and 402 under the bottom of the hole 308 may also be used as a support bulk used to strengthen the structure below the bottom of the hole 308.

It should be appreciated that the support bulk below the bottom of the hole 308 is not limited to simultaneously serve as a connection bulk. For example, in the embodiment shown in FIG. 3B, the support bulk under the bottom of the hole 308 only includes the connection layer 302. In this case, the connection layer 302 only serves as a support bulk and does not serve as a connection bulk between the chip 300 and the chip 400.

Figure 4A:
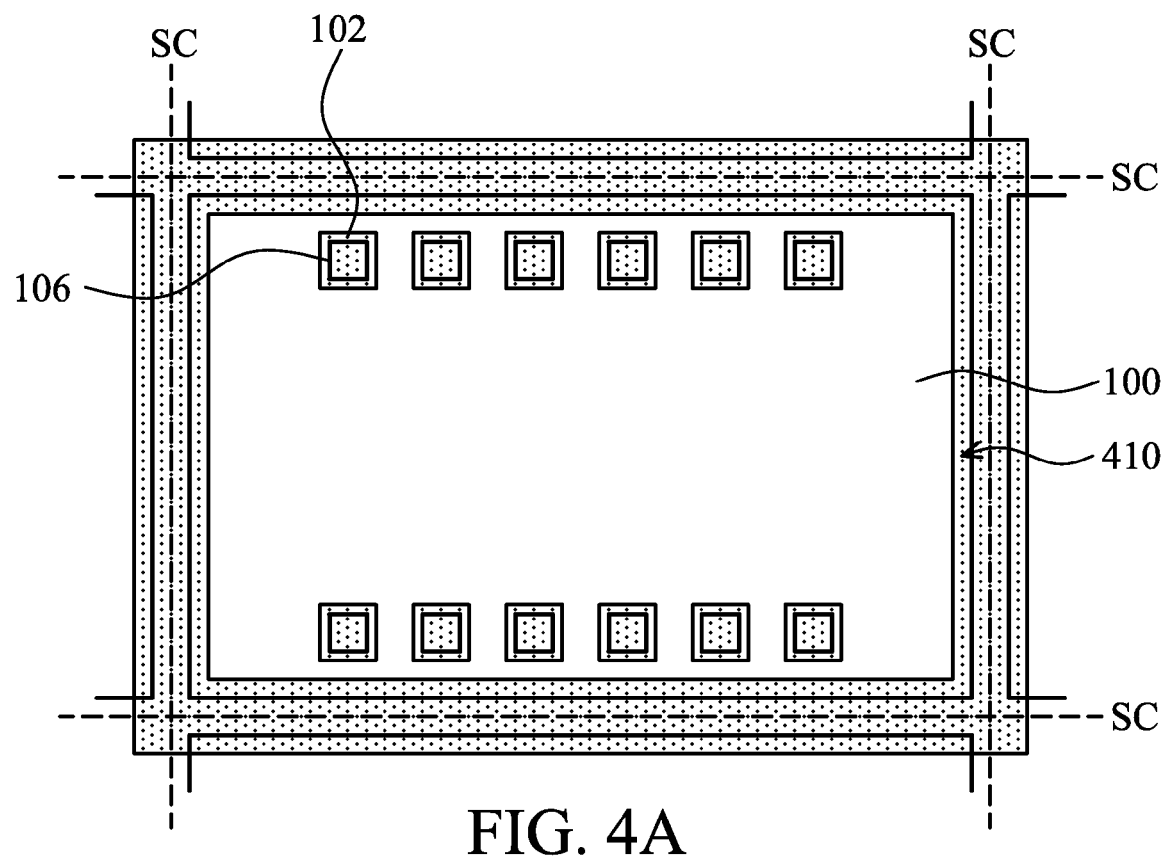
FIGS. 4A-4E are illustrative top views respectively showing chip packages before a dicing process is performed according to embodiments of the present invention.

FIGS. 4A-4E are illustrative top views respectively showing chip packages before a dicing process is performed according to embodiments of the present invention, which are used to show positions of the connection layer 102. The embodiment shown in FIG. 4A is similar to the embodiment shown in FIG. 1. In this embodiment, the connection layer 102 covers the conducting region 106. Referring also to FIG. 1I, the connection layer 102 on the conducting region 106 not only connects the upper and the lower chips together, but also is used as a support bulk under the hole to ensure that the chip package is prevented from being broken by external force during the fabrication process and ordinal use. In addition, when the support bulk is formed, a portion of a seal ring structure 410 may be simultaneously formed. In one embodiment, the connection layer 102 may cover the predetermined scribe lines SC to surround a chip to be diced. After the upper and the lower chips are bonded, a portion of the connection layers 102 and 202 may together form a seal ring structure. The seal ring structure may be disposed on a periphery region of the lower chip and/or the upper chip to surround a device region on the lower chip and/or the upper chip, which can protect the device region from being affected by the external environment. For example, the seal ring structure facilitates blocking of moisture from entering the chip package.

Figure 4B:
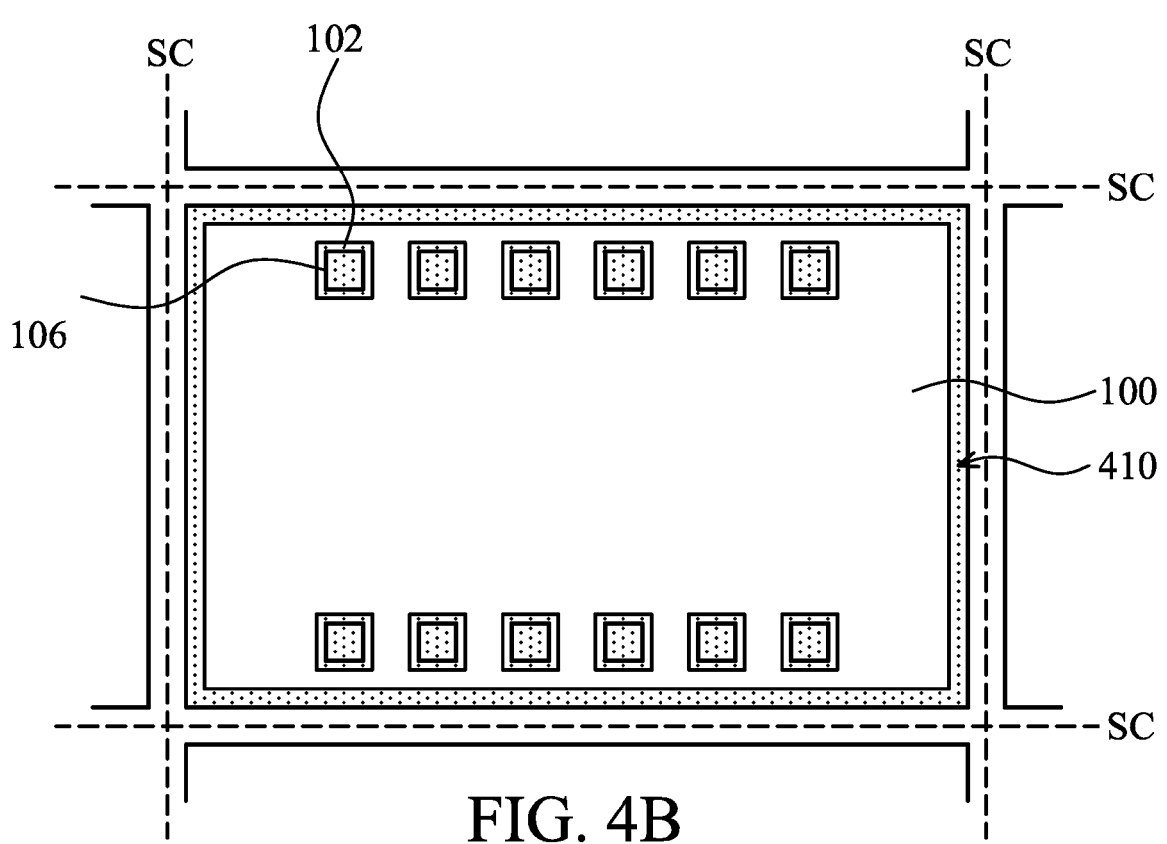

In the embodiment shown in FIG. 4B, the seal ring structure 410 may not reach the predetermined scribe lines SC, which may facilitate proceeding with the dicing process.

Figure 4C:
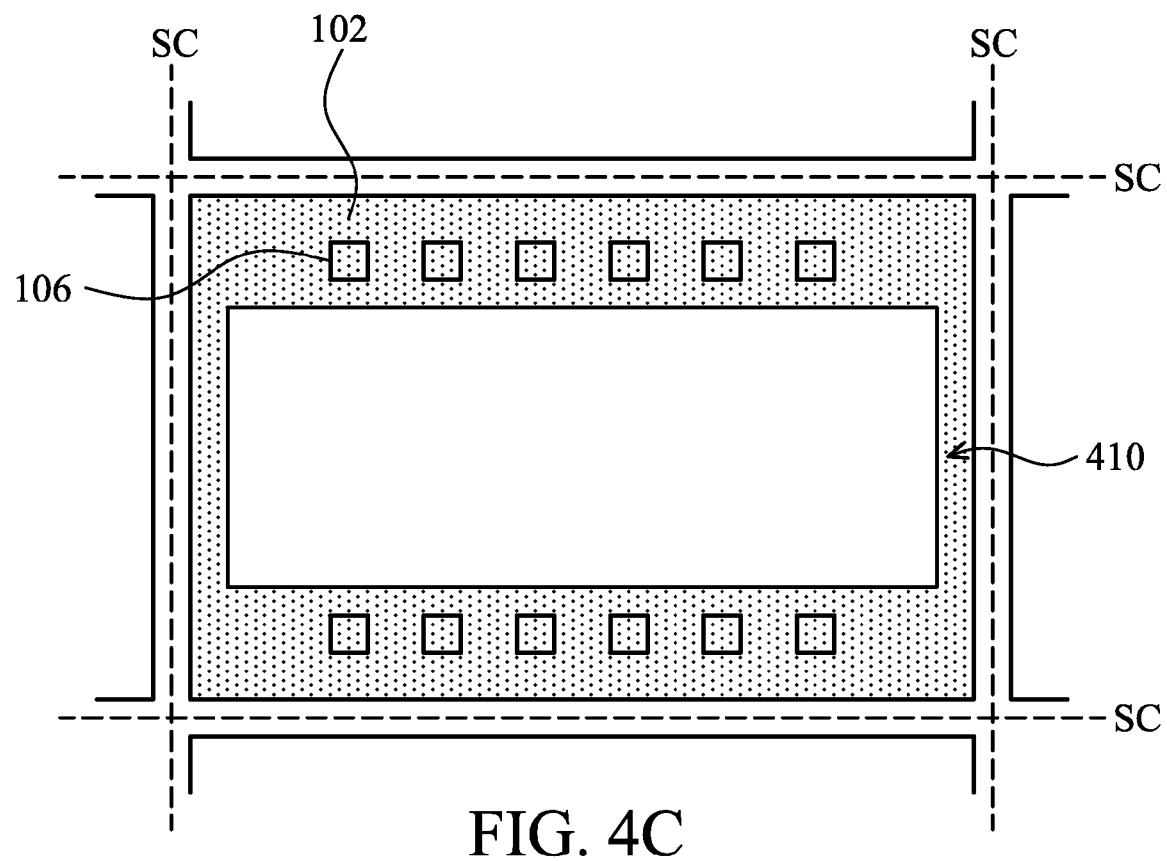

In the embodiment shown in FIG. 4C, the seal ring structure extends inwardly to cover the conducting region 106. Thus, in this embodiment, the seal ring structure may also be used as the connection bulk and the support bulk below the hole. In this embodiment, it should be appreciated that the insulating layer on the conducting region 106 may not be removed to prevent short circuiting from occurring. That is, to make sure that the connection layer 102 does not electrically contact with the conducting region 106. In this case, the conducting region 106 may be electrically connected to the upper chip through another wire.

Figure 4D:
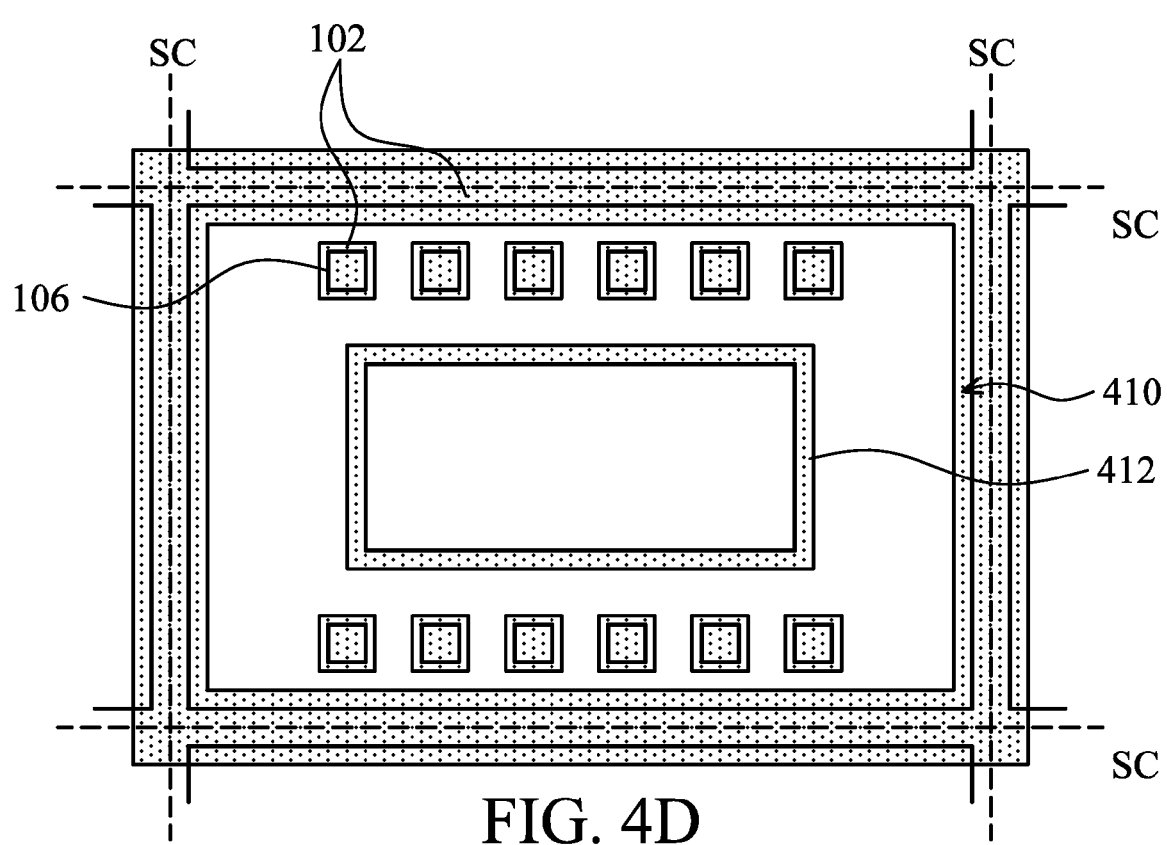
Figure 4E:
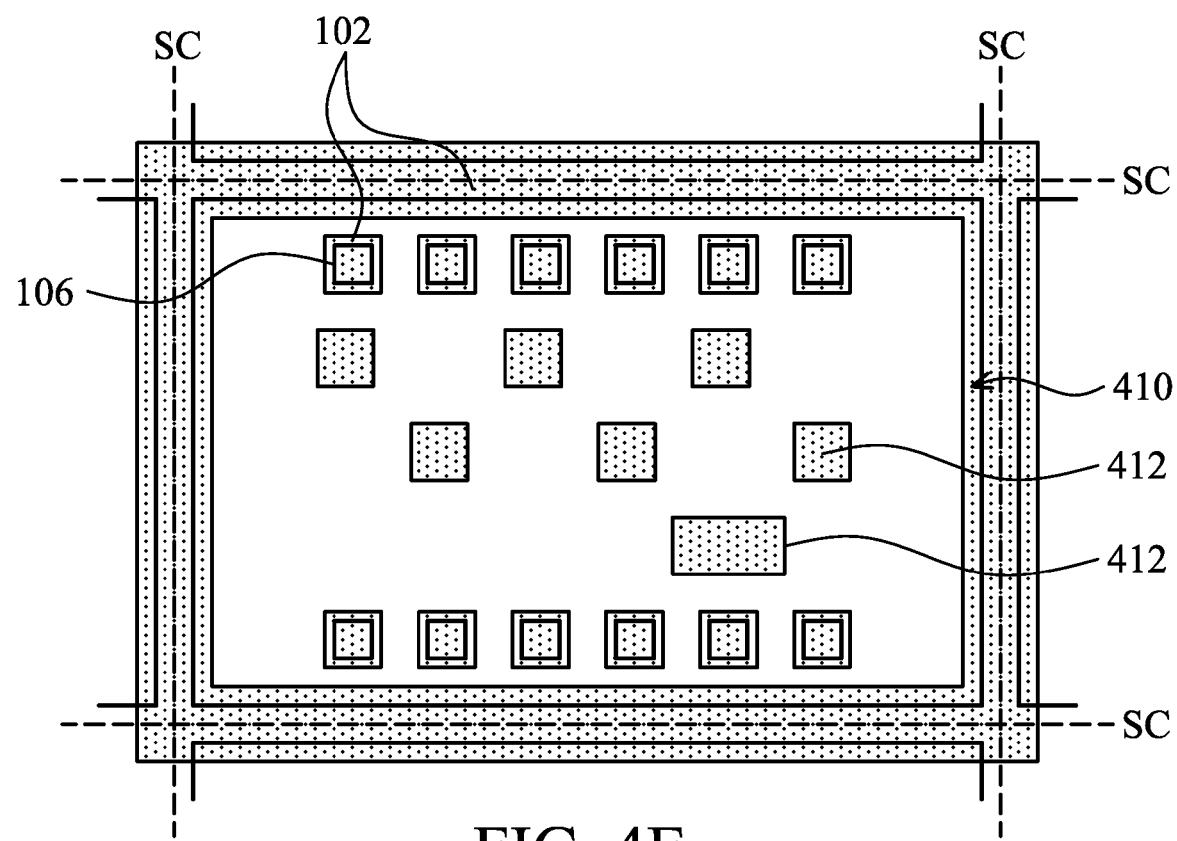

In the embodiments shown in FIGS. 4D and 4E, an auxiliary support structure 412 may be formed between the upper chip and the lower chip, which may be used to help with the bonding between the upper chip and the lower chip and strengthen the support of the upper chip. The auxiliary support structure 412 may be constructed by a portion of the connection layers 102 and 202. The auxiliary support structure 412 may be a ring structure (as shown in FIG. 4D) or a column structure (as shown in FIG. 4E).

Figure 5:
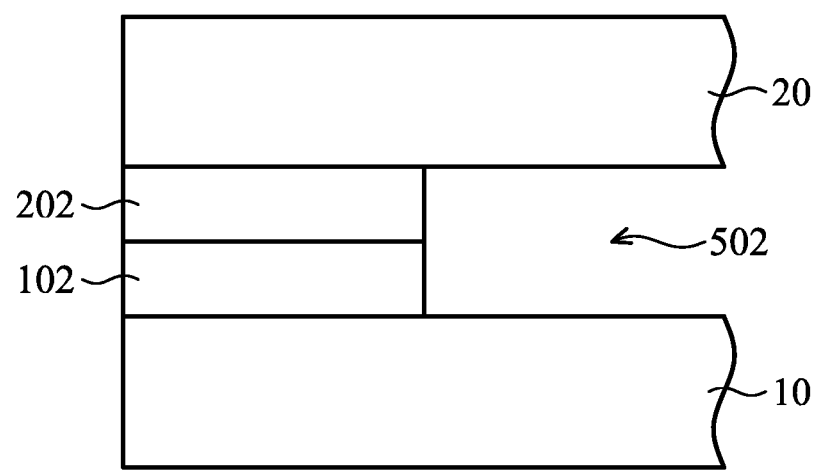
FIG. 5 is a cross-sectional view showing a chip package according to an embodiment of the present invention.

FIG. 5 is a cross-sectional view showing a chip package according to an embodiment of the present invention, wherein same or similar reference numbers are used to designate same or similar elements. In this embodiment, a wafer periphery seal ring structure may be disposed between the substrate 10 and the substrate 20, which may be disposed on a periphery region of the two substrates. The wafer periphery seal ring structure, the substrate 20, and the substrate 10 together form a cavity 502. The wafer periphery seal ring structure may also be constructed by a portion of the connection layers 102 and 202.

In the embodiments of the invention, through the disposition of the support bulk, the connection bulk, and/or the seal ring structure, reliability and structural stability of a chip package may be improved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a chip package, comprising:
providing a first substrate;
forming a support bulk on a first surface of the first substrate;
providing a second substrate;
bonding the second substrate on the first surface of the first substrate;
removing a portion of the first substrate from a second surface of the first substrate to form a hole extending towards the support bulk on the first substrate, wherein the support bulk substantially and/or completely covers a bottom of the hole;
forming a conducting layer on the second surface of the first substrate, wherein the conducting layer extends into the hole to electrically connect to a conducting region or a doped region in the first substrate; and
forming a protection layer on the second surface of the first substrate and extending into the hole, wherein the conducting layer is between the protection layer and the first substrate.

2. The method for forming a chip package as claimed in claim 1, wherein the protection layer has an opening exposing a portion of the conducting layer, and wherein the method further comprising forming a conducting bump on the exposed conducting layer.

3. The method for forming a chip package as claimed in claim 1, further comprising dicing the first substrate and the second substrate to form at least a chip package.

4. The method for forming a chip package as claimed in claim 1, further comprising:
forming a connection bulk on a surface of the second substrate; and
bonding the first substrate and the second substrate by the connection bulk.

5. The method for forming a chip package as claimed in claim 4, wherein the connection bulk directly bonds with the support bulk.

6. The method for forming a chip package as claimed in claim 4, further comprising disposing at least a seal ring structure between the first substrate and the second substrate, wherein the seal ring structure surrounds a device region on the first substrate and/or the second substrate.

7. The method for forming a chip package as claimed in claim 6, wherein the seal ring structure is formed in a step by directly bonding the connection bulk with the support bulk.

8. The method for forming a chip package as claimed in claim 1, further comprising thinning the first substrate before the hole is formed.

9. The method for forming a chip package as claimed in claim 1, further comprising disposing at least an auxiliary support structure between the first substrate and the second substrate.

10. The method for forming a chip package as claimed in claim 1, wherein the first substrate and the second substrate are two semiconductor substrates.

11. The method for forming a chip package as claimed in claim 10, further comprising disposing a wafer periphery seal ring structure between the first substrate and the second substrate, wherein the wafer periphery seal ring structure, the first substrate, and the second substrate together form a cavity.

12. A method for forming a chip package, comprising:
providing a first substrate;
forming a support bulk on a first surface of the first substrate;
providing a second substrate;
bonding the second substrate on the first surface of the first substrate;
removing a portion of the first substrate from a second surface of the first substrate to form a hole extending towards the support bulk on the first substrate, wherein the support bulk substantially and/or completely covers a bottom of the hole;
forming a conducting layer on the second surface of the first substrate, wherein the conducting layer extends into the hole to electrically connect to a conducting region or a doped region in the first substrate; and
disposing at least a seal ring structure between the first substrate and the second substrate, wherein the seal ring structure surrounds a device region on the first substrate and/or the second substrate.

13. The method for forming a chip package as claimed in claim 12, further comprising:
forming a protection layer on the second surface of the first substrate, wherein the protection layer has an opening exposing a portion of the conducting layer; and
forming a conducting bump on the exposed conducting layer.

14. The method for forming a chip package as claimed in claim 12, further comprising dicing the first substrate and the second substrate to form at least a chip package.

15. The method for forming a chip package as claimed in claim 12, further comprising:
forming a connection bulk on a surface of the second substrate; and
bonding the first substrate and the second substrate by the connection bulk.

16. The method for forming a chip package as claimed in claim 15, wherein the connection bulk directly bonds with the support bulk.

17. The method for forming a chip package as claimed in claim 12, wherein the seal ring structure is formed in a step by directly bonding the connection bulk with the support bulk.

18. The method for forming a chip package as claimed in claim 12, further comprising thinning the first substrate before the hole is formed.

19. The method for forming a chip package as claimed in claim 12, further comprising disposing at least an auxiliary support structure between the first substrate and the second substrate.

20. The method for forming a chip package as claimed in claim 12, wherein the first substrate and the second substrate are two semiconductor substrates.

21. The method for forming a chip package as claimed in claim 20, further comprising disposing a wafer periphery seal ring structure between the first substrate and the second substrate, wherein the wafer periphery seal ring structure, the first substrate, and the second substrate together form a cavity.

22. A method for forming a chip package, comprising:
providing a first substrate;
forming a support bulk on a surface of the first substrate;
providing a second substrate;
bonding the second substrate on the surface of the first substrate;
removing a portion of the first substrate from a second surface of the first substrate to form a hole extending towards the support bulk on the first substrate, wherein the support bulk substantially and/or completely covers a bottom of the hole;
forming a conducting layer on the second surface of the first substrate, wherein the conducting layer extends into the hole to electrically connect to a conducting region or a doped region in the first substrate; and disposing a wafer periphery seal ring structure between the first substrate and the second substrate, wherein the wafer periphery seal ring structure, the first substrate, and the second substrate together form a cavity.

23. The method for forming a chip package as claimed in claim 22, further comprising:
forming a protection layer on the second surface of the first substrate, wherein the protection layer has an opening exposing a portion of the conducting layer; and
forming a conducting bump on the exposed conducting layer.

24. The method for forming a chip package as claimed in claim 22, further comprising dicing the first substrate and the second substrate to form at least a chip package.

25. The method for forming a chip package as claimed in claim 22, further comprising:
forming a connection bulk on a surface of the second substrate; and
bonding the first substrate and the second substrate by the connection bulk.

26. The method for forming a chip package as claimed in claim 25, wherein the connection bulk directly bonds with the support bulk.

27. The method for forming a chip package as claimed in claim 22, further comprising disposing at least a seal ring structure between the first substrate and the second substrate, wherein the seal ring structure surrounds a device region on the first substrate and/or the second substrate, and is formed in a step by directly bonding the connection bulk with the support bulk.

28. The method for forming a chip package as claimed in claim 22, further comprising thinning the first substrate before the hole is formed.

29. The method for forming a chip package as claimed in claim 22, further comprising disposing at least an auxiliary support structure between the first substrate and the second substrate.

30. The method for forming a chip package as claimed in claim 22, wherein the first substrate and the second substrate are two semiconductor substrates.

\* \* \* \* \*